United States Patent [19]
Penn

[11] 4,296,146
[45] Oct. 20, 1981

[54] METHOD FOR REMOVING RESIST LAYER FROM SUBSTRATE WITH COMBUSTIBLE GAS BURNOFF

[75] Inventor: Thomas C. Penn, Richardson, Tex.

[73] Assignee: Texas Instruments Incorporated, Dallas, Tex.

[21] Appl. No.: 856,900

[22] Filed: Dec. 2, 1977

[51] Int. Cl.$^3$ .............................................. B05D 5/12
[52] U.S. Cl. .................................... 427/58; 427/224; 427/226; 427/264; 427/270; 427/271
[58] Field of Search ............... 427/223, 224, 264, 270, 427/271, 273, 300, 346, 8, 226, 58; 118/47

[56] References Cited

U.S. PATENT DOCUMENTS

| | | | |
|---|---|---|---|
| 2,838,427 | 6/1958 | Pugh | 118/47 |
| 2,845,364 | 7/1958 | Waggoner | 118/47 |
| 2,868,669 | 1/1959 | Marzocchi et al. | 427/224 |
| 3,615,956 | 10/1971 | Irving et al. | 156/645 |
| 3,962,213 | 6/1976 | Flynn | 427/224 |
| 3,995,073 | 11/1976 | Kuonen et al. | 118/47 |

OTHER PUBLICATIONS

An Introduction to Photofabrication Using Kodak Photosensitive Resists, (Eastman Kodak Co., Rochester, N.Y. 14650), p. 27.
Condensed Chemical Dictionary 6th Ed., Rheinhold, N.Y., pp. 587 and 588.

Primary Examiner—Ronald H. Smith
Assistant Examiner—Janyce A. Bell
Attorney, Agent, or Firm—William E. Hiller; Melvin Sharp; James T. Comfort

[57] ABSTRACT

Method and apparatus for removing a resist layer from a substrate surface of different material, such as a semiconductor slice, in the fabrication of an electronic structure, involving exposure of the resist layer to a flame from a combustible gas. The resist layer is employed as a mask in patterning the substrate surface via selective etching, diffusion, or other procedures and is removed from the substrate when it has served its purpose. The resist material may include not only light-sensitive resists more commonly termed "photoresists", but also electron beam-sensitive resists, and resists applied by stencil techniques. The resist layer is exposed to the flame for a period of time sufficient to decompose the resist material, the length of the exposure being a function of several factors, including the type of resist, the thickness of the layer, and the manufacturing processes to which the slice was subjected prior to the resist removal step. No vacuum or other special ambient atmospheric condition is required for this resist removal process, but the slice may be positioned on a belt or other mobile platform and the means for producing the flame may also be adjustable in order to effectively vary the parameters of exposure time and temperature, depending on the aforementioned factors.

16 Claims, 10 Drawing Figures

METHOD FOR REMOVING RESIST LAYER FROM SUBSTRATE WITH COMBUSTIBLE GAS BURNOFF

BACKGROUND OF THE INVENTION

This invention concerns a method and apparatus for removing or stripping a layer of resist material from a substrate surface of different material, such as a semiconductor slice, in the fabrication of an electronic structure, such as a discrete semiconductor device including transistors, diodes, etc., an integrated circuit, or a printed circuit board, wherein the removal of the layer of resist material is accomplished by subjecting same to the flame from a combustible gas for a period of time sufficient to chemically decompose the resist material.

Photoresist materials are commonly used in a wide number of industrial processes where it is desired to provide detailed patterns on a substrate surface in thin films applied thereto or to provide regions of altered character as contrasted to other surface portions of the substrate. Such photoresist materials are photosensitive in nature, being characterized by differential reactivity to specific liquid solvents after exposure to any energy source, such as ultraviolet radiation, for example. A standard photographic practice in employing photoresist layers as patterns involves the application of a layer of photoresist material to a substrate, followed by the selective exposure of the photoresist layer to an energy source, wherein portions of the photoresist layer are changed in character due to their exposure to the energy source. After such exposure, the photoresist layer is then developed by a "wet development process" employing liquid chemical solvents to selectively remove portions of the photoresist for providing the desired pattern therein. Negative and positive photoresist materials are available for this purpose. In a negative photoresist material, the portion of a layer thereof exposed to the energy source is changed in its chemical character being polymerized as contrasted to the non-exposed portion and rendering it insoluble with respect to the liquid chemical solvent which removes the non-exposed portion of the negative photoresist layer in producing the desired pattern therein. For a positive photoresist layer, the situation is reversed in that the portion thereof exposed to the energy source is rendered soluble to the liquid solvent, while the non-exposed portion is insoluble with respect thereto and remains intact after development in forming the desired pattern.

Stripping of the patterned photoresist layer becomes necessary in most instances in the fabrication of an electronic structure after its purpose in providing a patterned mask has been served, such as for the selective application of a thin film to the underlying substrate surface or for the application of dopant materials to selected regions of the substrate, for example. Many fabrication processes for manufacturing discrete electronic devices and integrated circuits require repeated uses of photo-resist layers at various stages of the process before the electronic structure is completed. Removal or stripping of each photoresist layer after it has served its purpose in the fabrication of the electronic structure is required before the additional stages in the fabrication process may be accomplished, or at least as the final stage in completing the fabrication of the electronic structure.

Many different types of "wet" solvent developers have been employed to remove exposed or unexposed portions of a photoresist layer from an underlying substrate surface. Typical of such wet developers are the hydrogen peroxide-sulfuric acid developers and those based on phenol-methyl ethyl ketone and trichloroethylene. In the hydrogen peroxide-sulfuric acid system, a mixture of 10 to 33.3% of hydrogen peroxide and 66.6–90% of sulfuric acid can be used for the complete removal of the photoresist after acid etching on the exposed portion of the underlying substrate surface to be patterned has been completed. In general, such a system may be used for all photoresist removal processes except those requiring removal of a photoresist layer from an aluminum surface, since this particular system will dissolve aluminum. Inherent in the use of these chemicals is the problem of contamination from inorganic ions, which remain on the resist patterned substrate, commonly referred to as the "slice", after the development of the pattern is complete. This contamination results in additional chemical treatment being required of the developed slices for removal of such contamination involving further time, handling and expense in completing the fabrication of the electronic structure.

The class of wet developers based on phenol-methyl ethyl ketone and trichloroethylene is typically used on substrates having aluminum metalization layers, since this photoresist development and removal system does not chemically attack aluminum. However, development with this system is also time-consuming and is accompanied by a substantially high incidence of contamination.

Further, use of a wet solvent developer is generally responsible for the production of some residual material from the removed photoresist layer which remains on the substrate surface. This residual material also is present along the edges of the photoresist pattern where it tapers down to the substrate surface causing a decrease in pattern resolution tending to render the pattern detail less sharp in outline.

A further problem peculiar to the etching of an aluminum layer on a substrate, wherein the aluminum layer is initially overlaid by a photoresist layer which is developed by a conventional wet developer to provide an etch pattern for exposed portions of the aluminum layer, is the generation of hydrogen bubbles by the chemical etchant in reacting with the aluminum metal. These hydrogen bubbles tend to form on the surface of the aluminum layer, particularly seeming to congregate around the residue left by the wet developer. Their presence prevents fresh acid from reaching the aluminum surface and inhibits proper etching thereof. Previously, various wetting agents and mechanical agitation have been employed to alleviate this problem with some success in that these means have facilitated the release of the hydrogen bubbles from the aluminum surface.

In addition to wet process development techniques for removing a layer of photoresist material, another technique which may be said to be based on a non-solvent or dry basis has heretofore been employed for the purpose of removing photoresist material. This technique employs plasma etching as obtained through an oxygen RF plasma process wherein the generated plasma containing monatomic oxygen as an active species is employed to remove the layer of photoresist material. A description of plasma etching for photoresist removal may be found in the article "A Dry Photoresist Removal Method"—Irving, published in *Kodak Photoresist Seminar Proceedings*—1968, edition, Vol. II, pp. 26-29. Generally, plasma containing monatomic oxygen O may be generated by placing diatomic oxygen ($O_2$) molecules in an evacuated chamber and providing an electric field of sufficient force to disassociate the oxygen ($O_2$) molecules. The so-called plasma machines or "ashers" are generally AC systems operating at radio frequencies in the Khz range. Typically, two opposing horizontal flat electrode plates or tubular electrodes are employed for purposes of generating the plasma therebetween. As recognized in the art, the term "asher" is generally applied to an RF plasma machine employed for the purpose of removing photoresist material by plasma etching. This oxygen RF plasma technique, although effective to remove photoresist material, is characteristically slow, requiring from 10 to 30 minutes for removal of the photoresist material and also commonly requiring batch processing rather than continuous processing, wherein individual slices or groups of slices must be loaded and unloaded in a batch procedure from a Bell jar. Furthermore, semiconductor slices incorporating MOS technology (metal-oxide-semiconductor technology) may be subject to degradation by the use of this technique for removing photoresist material therefrom because of their excessive sensitivity to electric fields.

Another technique for stripping photoresist material from a substrate which may be said to be a so-called dry removal method employs an ozone treatment and is described in detail in pending application Ser. No. 601,861, filed Aug. 4, 1975, by Samuel Ray Shortes et al and assigned to the assignee of the present invention. The ozone treatment technique involves the exposure of the photoresist layer to an ozone-containing gaseous atmosphere in the reaction zone of a reactor, the ozone being present as an active reagent in the gaseous atmosphere to which the layer of photoresist material is exposed in an amount sufficient to react with all of the photoresist material in the layer thereof, with the photoresist material being removed from the underlying substrate surface in response to exposure to the ozone. Although the aforementioned ozone technique effectively eliminates most of the stated problems inherent in wet development techniques, it requires a special atmosphere and utilizes a gas which is both expensive and potentially dangerous to human beings in large amounts.

SUMMARY OF THE INVENTION

This invention is directed to a method and apparatus for removing a layer of resist material from a substrate surface of a different material, such as a semiconductor slice, in the fabrication of an electronic structure, wherein the removal of the layer of resist material is accomplished by exposing the resist layer to a flame from a combustible gas, such as hydrogen-oxygen mixture, for a period of time sufficient to chemically decompose all of the resist material included in the layer thereof. Although this invention is described specifically in relation to the removal of light-sensitive resists more commonly termed "photoresists" from a substrate surface, the term "resist" as employed herein is intended to include not only photoresists, but also electron beam-sensitive resists, and resists applied by stencil techniques. It is not necessary to supply a vacuum or other special ambient atmospheric condition for this resist removal process to operate efficiently. Because liquid solvents are not necessary for removal of the resist according to this method, all the aforementioned problems associated therewith are eliminated. Combustible gases are also readily available and are extremely inexpensive as compared with the liquid solvents used in conventional photoresist removal operations. Because the substrate slice is exposed to the flame only for a time sufficient to chemically decompose the resist layer thereon, the temperature of the slice is not elevated to a magnitude sufficient to damage devices fabricated within the substrate. For instance, if a charge coupled RAM cell such as that described in *IEEE Journal of Solid State Circuits*, Vol. SC-11, No. 1 (February 1976) at pp. 58-63, having diffusions of $N^+$ and $P^+$ material near the surface of the slice is fabricated thereon, the temperature to which the slice is subjected will not operate to drive the diffusions deeper, which if it occurred would destroy the cell. The resist removal process described herein may be described as a burnoff technique, and varies with respect to two parameters—exposure time and temperature. The slice may be positioned on a movable belt, turntable, or other such mobile surface and the means for producing the flame from the combustible gas may also be mobile so that the aforementioned parameters may be varied to increase the efficiency of the removal process. It is necessary to have the ability to vary the exposure time and temperature since the efficient removal of the resist depends on several factors, including the type of resist, the thickness of the layer, and the process steps to which the slice has been subjected prior to the resist removal step. In a more specific aspect of the invention, the substrate may be subjected to a multiple flame exposure, wherein intermittent exposure to a flame is achieved to avoid the build-up of heat on the substrate and photoresist layer which would have a tendency to bake the photoresist with attendant resistance to removal.

DETAILED DESCRIPTION OF THE DRAWINGS

Figure 1A:
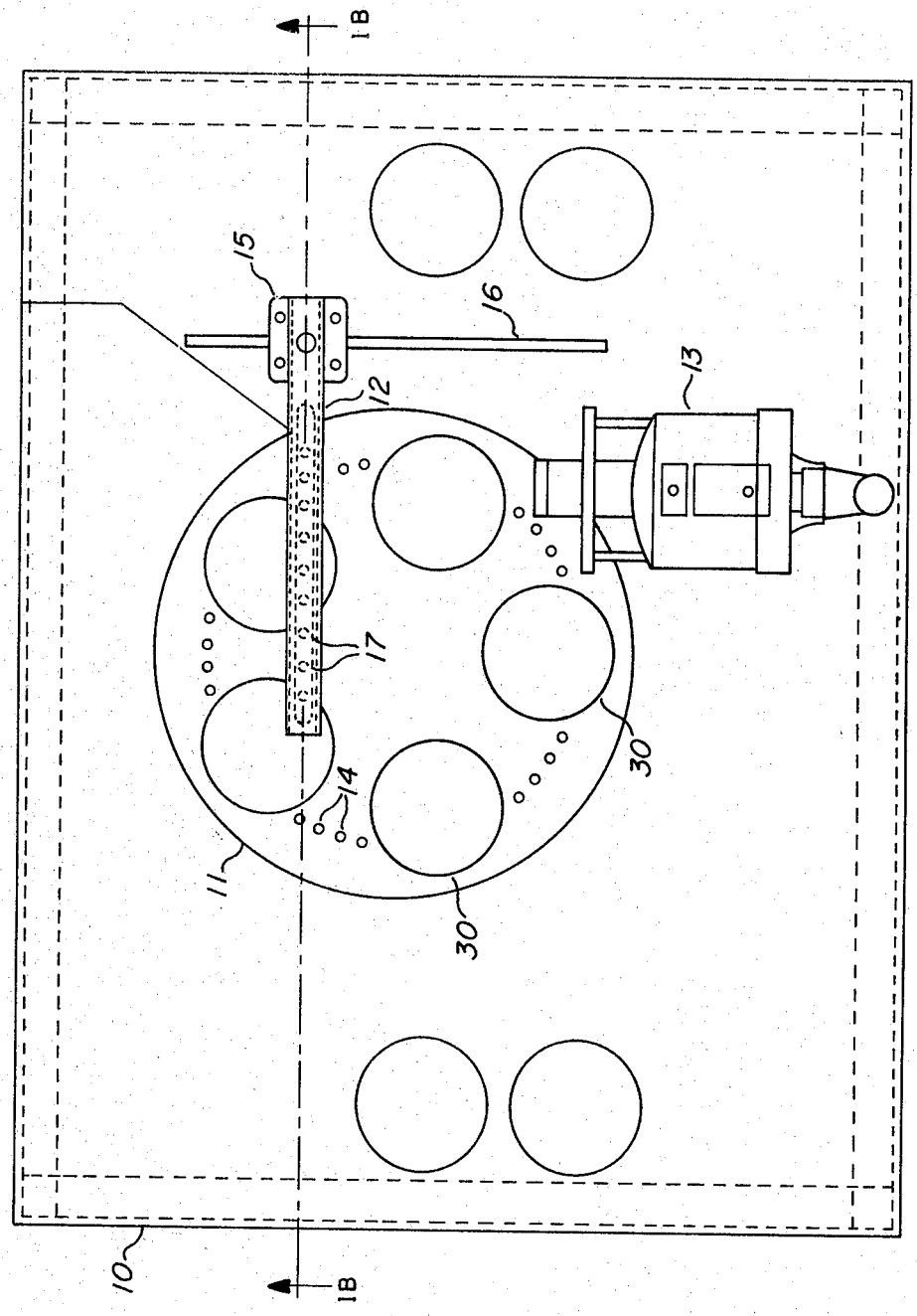
FIG. 1A is a plan view of an apparatus suitable for practicing the method of resist removal by flame burnoff in accordance with the present invention.
Figure 1B:
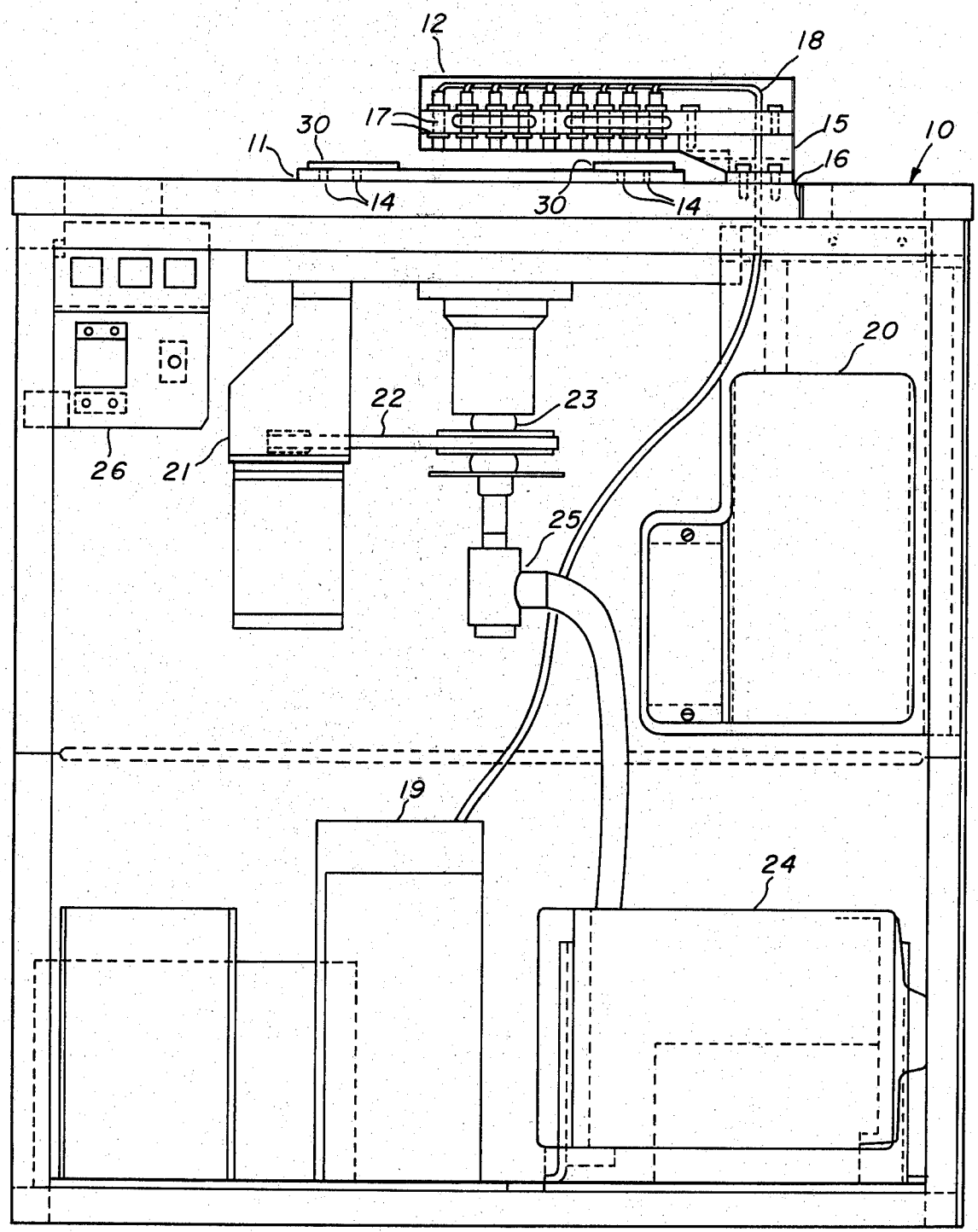
FIG. 1B is a sectional view taken along the line 1B—1B of FIG. 1A, FIGS. 2A-2E are diagrammatic section views of a semiconductor slice having a layer of resist material disposed thereon in various stages during a resist removal process in accordance with the present invention.

Referring more specifically to the drawings, FIGS. 1A and 1B illustrate one embodiment of an apparatus suitable for practicing the method of resist removal by flame burnoff in accordance with the present invention. In FIG. 1A, the apparatus comprises a housing 10, whose top surface is provided with a rotatable turntable member 11, a suspended arm member 12 which extends over the turntable member 11, and a temperature sensing member 13 which partially extends over the turntable 11.

The turntable member 11 is adapted to be rotated at an adjustable rate and is provided with a plurality of apertures 14 which extend through the turntable member 11 into the interior of the housing 10. The apertures 14 communicate with a suitable vacuum source which induces suction therethrough wherein the apertures 14 operate to hold semiconductor slices 30 relatively stationary on the surface of the turntable member 11 during the resist removal process as the turntable member 11 is being rotated. The elongated arm member 12, which extends over the turntable member 11, is suspended from the top surface of the housing 10 by means of a mounting member 15. The mounting member 15 is slidably received within an elongated slot 16 in the top surface of the housing 10 adjacent to the turntable member 11. The mounting member 15 may contain means for adjusting the postion of the arm member 12 in various ways, such as means for locating the arm member 12 at a predetermined angle with respect to the top surface of the housing 10 or means for raising or lowering the arm member 12 so that it may be suspended over the turntable member 11 spaced a predetermined distance thereabove. The arm member 12 contains a plurality of linearly arranged flame outlets 17 disposed along its bottom surface and facing the turntable member 11. During the resist removal process, the arm member 12 may be made to sweep across the turntable member 11 as the mounting member 15 moves along the elongated slot 16 within which it is received. The temperature sensing member 13 may be a suitable conventional device of the type having a temperature-sensitive photodevice or other detector which is capable of sensing and measuring the thermal qualities of a given surface. The temperature sensing member 13 partially extends over the turntable member 11 in order that it may be operably associated with the semiconductor slices 30 disposed thereon during the resist removal process. The temperature sensing member 13 monitors the temperature of the semiconductor slices 30 during the resist removal process in order to insure that the slices 30 are not heated to temperatures of a magnitude which could operate to destroy the slices 30 or the devices fabricated thereon. As may be seen more clearly in FIG. 1B, the turntable 11 is driven by a motor 21 which is engaged with a drive belt 22, the drive belt 22 being connected to a pulley on a drive shaft 23. The drive shaft 23 is mounted to depend from the top surface of the housing 10 within the interior thereof and is provided with a hollow region through which a vacuum may be maintained so that the apertures 14 in the turntable 11 may be supplied with a vacuum-induced suction via a vacuum source. To this end, a vacuum pump 24 communicating with the apertures 14 in the turntable 11 is connected to the bottom of the device shaft 23 by means of a rotary pipe joint 25. The flame outlets 17 of the arm member 12 are connected via a flexible gas supply tube 18 to a combustible gas reservoir 19 located within the housing 10. The reservoir 19 may also contain a mixing chamber and a valve system if a gas mixture, such as a mixing of hydrogen and oxygen, is used in the result removal process. A drive motor 20 within the housing 10 is operably connected to the mounting member 15 for moving the mounting member 15 within the elongated slot 16 so as to cause the arm member 12 to sweep across the turntable member 11 during the resist removal process. The apparatus includes a control panel 26 for regulating the speed of rotation of the turntable 11, the sweeping motion of the arm member 12 and other components of the apparatus, and for controlling the parameters which affect the resist removal process.

In a semiconductor manufacturing operation, the apparatus of FIG. 1 may also be provided with one or more cartridge members located adjacent to the turntable 11 of serially feeding semiconductor slices onto the turntable 11 and removing the slices therefrom after completion of the resist removal process for each slice.

Figure 2A:
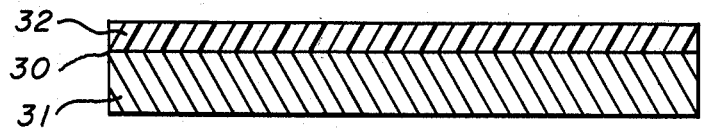
Figure 2B:
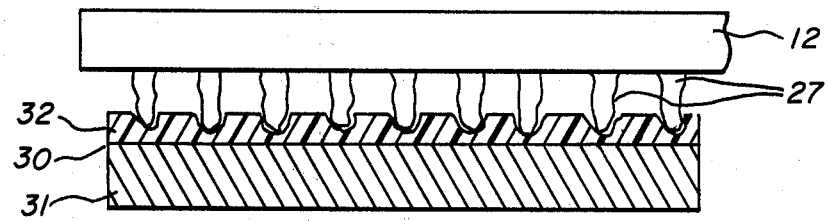
Figure 2C:
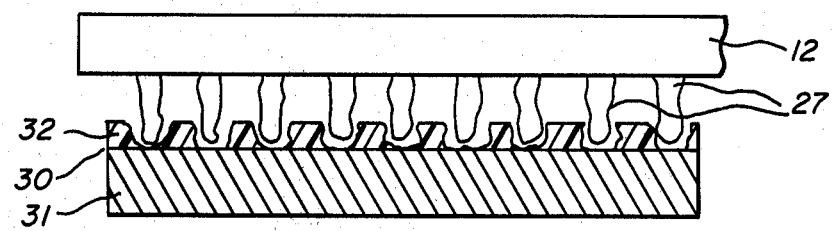
Figure 2D:
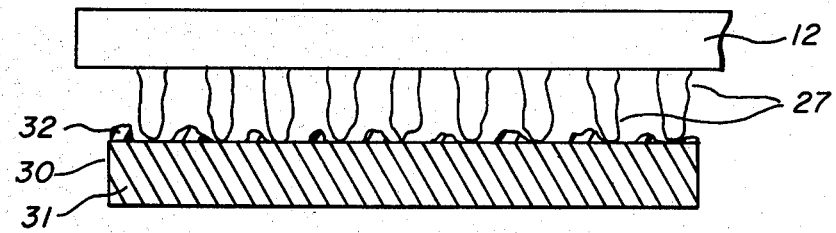
Figure 2E:
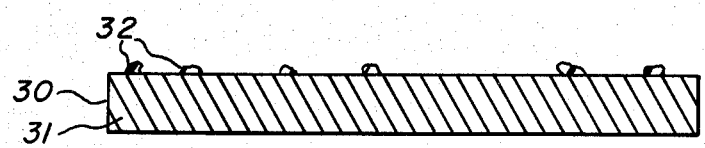

FIGS. 2A–2E diagrammatically illustrate a semiconductor slice 30 comprising a substrate 31 and a layer of resist material 32 disposed thereon during various stages of the resist removal process in accordance with the present invention. FIG. 2A, shows the semiconductor slice 30 prior to commencement of the process for removing the resist layer 32 from the substrate 31, the layer of resist material 32 being shown as a solid layer of material. As shown in FIG. 2B, the semiconductor slice 30 is brought into proximity with the arm member 12 which serves as a flame source. In this respect, the arm member 12 is provided with the plurality of flame outlets 17 from which flames 27 are emitted, such that the flames 27 directly contact the resist layer 32 for removing the resist layer 32 from the substrate 31 via decomposition of the resist material. As shown in FIGS. 2C–2E showing successive stages of resist removal, the semiconductor slice 30 may be exposed to the flames 27 from the flame source 12 until the resist layer 32 is completely removed from the substrate 31. It will be understood that the duration of each such flame exposure and the number of flame exposures varies with such factors as the thickness of the resist layer, the type of combustible gas used in the process, and the processing history of the slice. In the latter connection, for instance, extended baking cycles or plasma discharges in the vicinity of a photoresist layer prior to its removal tend to enhance cross-linking of the organic polymer material thereof, thereby increasing the resistance of the photoresist to removal, so that longer flame exposure or an increase in the number of flame exposures might be required for effective decomposition of such a photoresist layer. As shown in FIG. 2E, the result of the burnoff process is to remove the resist layer 32 from the substrate 31, with the possible exception of isolated residual particles of decomposed resist material 32 which may be cleaned from the substrate 31 by a bath of deionized water.

Although the exact chemical reaction which occurs during the process of the resist burnoff technique herein disclosed is not known, it is recognized that a flame is a type of plasma which contains ionic particles and monatomic oxygen. These reactive products contained in the flame of a combustible gas attack the resist material, which if a photoresist is basically a photosensitized isoprene or other hydrocarbon. In this connection, the resist material is actually impinged by or bathed in the flame, rather than merely being heated thereby. Thus, in the presence of monatomic oxygen and other active ionic species, the resist material decomposes into water vapor ($H_2O$) and carbon dioxide ($CO_2$). It is important to recognize that the resist removal technique herein disclosed is based on the decomposition of the resist material by chemical reaction rather than the melting of the resist material. Decomposition of the resist material occurs rapidly at the surface temperature without the bulk exceeding the flow temperature thereof, and this low temperature removal is critical to the removal technique since temperatures on the order of the melting temperature of the resist material would operate to destroy the semiconductor slice and the devices fabricated thereon. Thus, it has been found that resist removal according to the present invention may be accomplished at substrate temperatures on the order of 60° C. to 350° C., with the flame exposure time on the order of 2–15 seconds. The process has been practiced utilizing both propane and a hydrogen-oxygen mixture as the combustible gas, but it will be understood that any combustible gas which produces a flame containing ionic particles capable of decomposing the resist would be suitable in practicing the method of resist removal in accordance with this invention. However, a hydrogen-oxygen mixture is preferred for cleanliness, wherein the hydrogen is present in a range of 5–95% by volume and oxygen is present in a range of 95–5% by volume. More specifically, it is preferred that hydrogen be present in a range of 40–67% by volume so that the flame will be relatively oxygen-rich to promote the presence of active oxidizing species therein. It is also to be understood that multiple passes of the semiconductor slice 30 through the flame may not be necessary for the successful removal of the resist layer 32, although this is a convenient procedure for monitoring the temperature of the slice 30 and for insuring that overexposure of the slice 30 to the flame 27 does not occur.

Figure 3A:
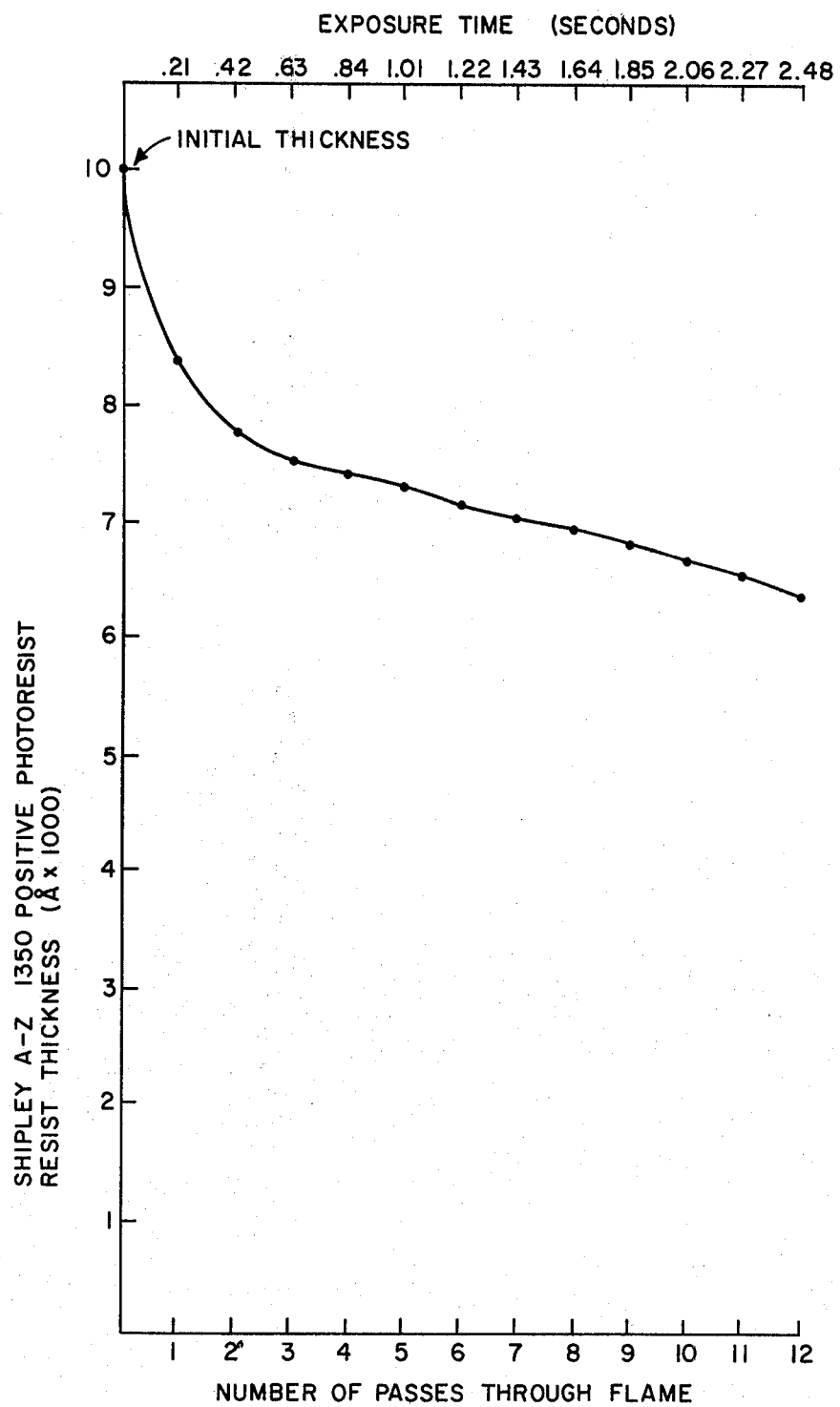
FIGS. 3A-3C are graphs showing the removal rates of different resists from a substrate by means of the resist removal process in accordance with the present invention.
Figure 3B:
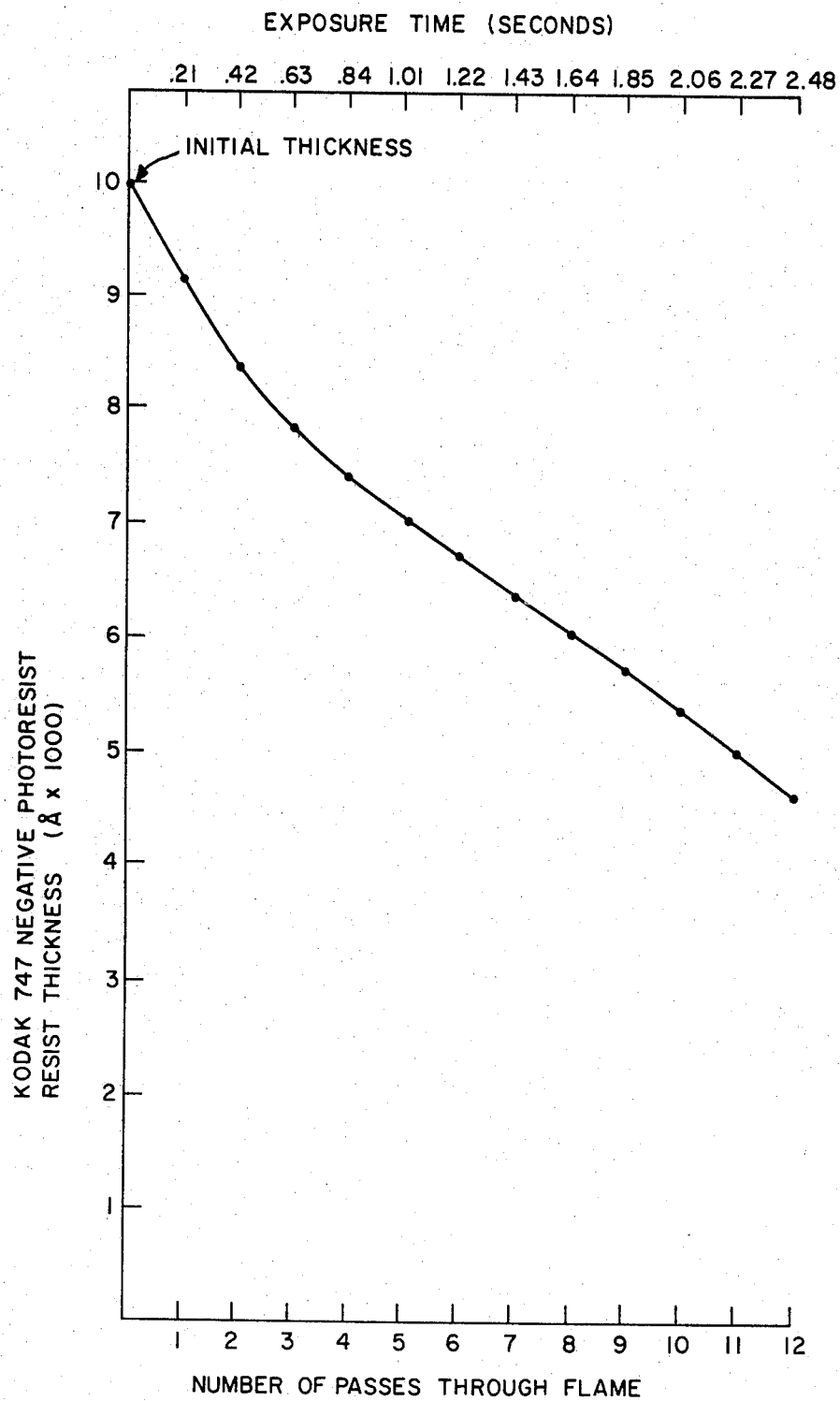
Figure 3C:
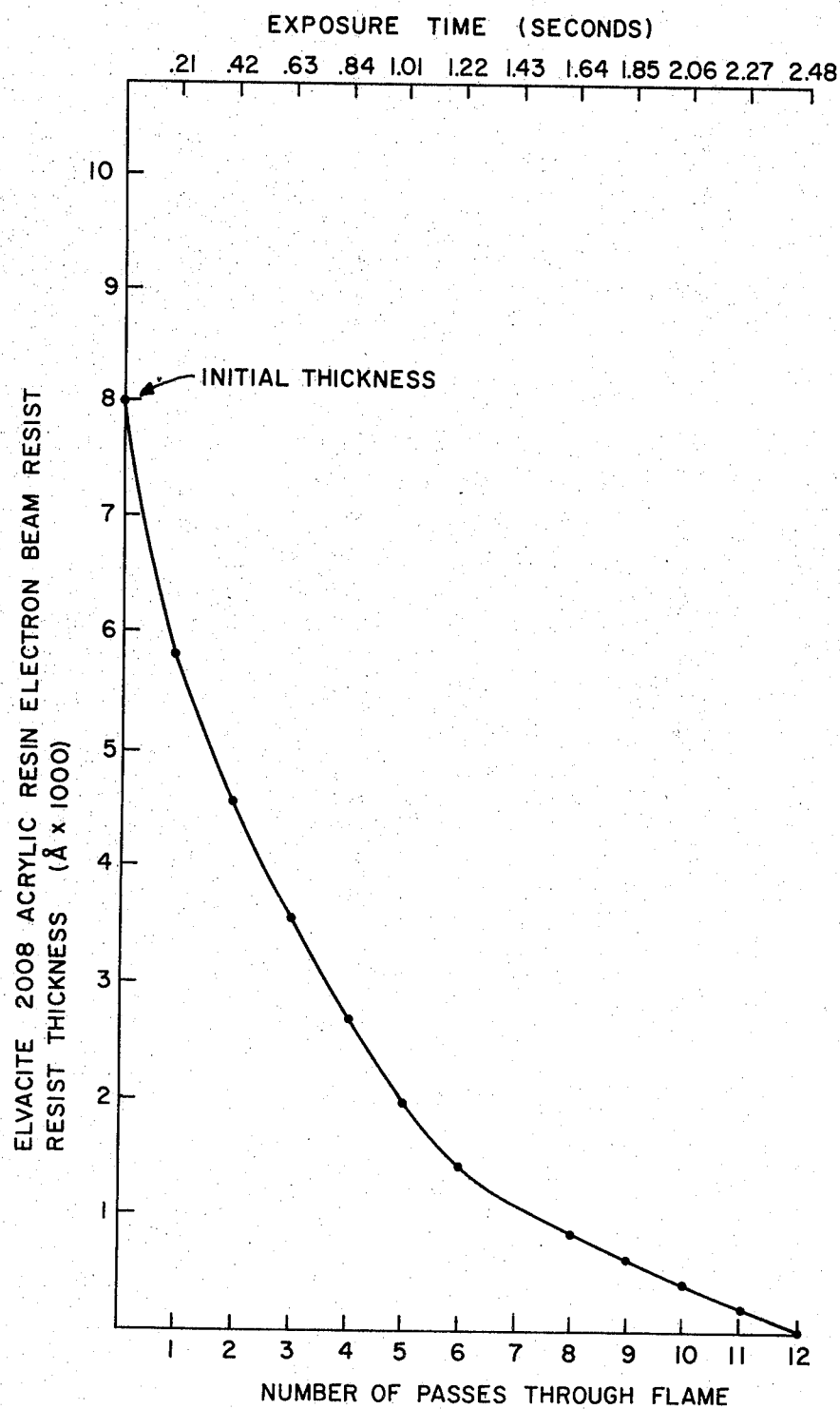

FIGS. 3A–3C are graphs showing the removal rate of different resist materials from a semiconductor substrate by means of the resist removal process of the present invention, the vertical axis representing the thickness of the resist layer and the horizontal axis representing the flame exposure time. The graphs of FIGS. 3A–3C depict test results wherein semiconductor slices with a solid layer of resist material disposed thereon were subjected to a flame from a hydrogen/oxygen mixture. The gas flow rates during these tests were 11.7 liters per minute hydrogen and 8.2 liters per minute oxygen. The apparatus of FIG. 1 was utilized, with the arm member 12 being held stationary in a position such that the flame outlets 17 were spaced approximately 1/16" above the turntable member 11. The turntable member 11 was rotated at a speed of 24 revolutions per minute, and a nitrogen gas jet was utilized to keep the slices at an average temperature of approximately 200° C. during the burnoff process.

FIG. 3A is a graph of the removal rate of Shipley A-Z 1350 positive photoresist by the burnoff process in accordance with the present invention. The photoresist layer was spun on the substrate and baked for 20 minutes at 100° C., the result being a solid layer of photoresist material approximately 10,000 A in thickness. In this test, the slice was subjected to 12 passes through the flame for a total flame exposure time of approximately 2.5 seconds. This treatment resulted in the removal of about 3,500 A of photoresist material. As shown in FIG. 3A, the removal rate for Shipley A-Z 1350 positive photoresist is quite high at first and then tapers off, the overall removal rate averaging about 40,000 A per minute.

FIG. 3B is a graph of the removal rate of Kodak 747 negative photoresist by the burnoff process in accordance with the present invention. The photoresist layer was spun on the substrate and baked for 20 minutes at 100° C., the result being a solid layer of photoresist material approximately 10,000 A in thickness. In this test, the slice was again subjected to 12 passes through the flame for a total flame exposure time of approximately 2.5 seconds. This treatment results in the removal of about 5300 A of photoresist material. As shown in FIG. 3B, the removal rate of Kodak 747 negative photoresist is fairly constant and is approximately 100,000 A per minute.

FIG. 3C is a graph of the removal rate of Elvacite 2,008 acrylic resin, which is polymethol methacrylic negative electron beam resist, by the burnoff process in accordance with the present invention. The electron beam resist layer was spun on the substrate and baked for 30 minutes at 160° C., the result being a solid layer of electron beam resist material approximately 8,000 A in thickness. As in the first two tests, the slice was subjected to 12 passes through the flame for a total flame exposure time of approximately 2.5 seconds. This treatment resulted in the removal of substantially all 8,000 A of electron beam resist material. As shown in FIG. 3C, the removal rate for Elvacite 2,008 acrylic resin negative electron beam resist was much higher than that of the photoresists tested, about 300,000 A per minute.

It has been found that the process of the present invention will remove any resist material, whether a negative or a positive type, and that the process will work efficiently even if the slice has been subjected to plasma discharges, large ion implant dosages or extended baking cycles, all of which tend to greatly complicate photoresist removal by conventional wet removal techniques as previously indicated herein. The photoresist removal rates for this process are extremely high as compared with conventional wet removal techniques using chemical solvents. For instance, approximately 20 minutes would be required to remove a 10,000 A layer of Shipley A-Z 1350 positive photoresist material by the well known "Piranha" photoresist removal technique, wherein the semiconductor slice is subjected to a solution of sulphuric acid and hydrogen peroxide existing in an approximate 2:1 ratio. The graph of FIG. 3A indicates that the process disclosed herein would remove a 10,000 A layer of this same photoresist material in approximately 15 seconds. It will be understood that the tests on which the graphs of FIGS. 3A–3C are based were conducted using a solid layer of resist material disposed on the substrate. On an actual semiconductor slice, the resist layer overlies only selected portions of the substrate. Thus, the removal rate of resist material achieved by practicing the process in accordance with the present invention would be even higher for an actual semiconductor slice. In the latter respect, the removal of a solid layer of photoresist material, for instance, is rendered more difficult by virtue of the additional cross-linking of the photoresist polymer material inherently present in a solid layer thereof.

The resist removal process of the present invention offers a substantial reduction in costs as compared to conventional wet removal techniques. It is also faster, safer and readily adapted to the semiconductor industry, both because of the availability of combustible gases and the simplicity of the process and the apparatus for practicing same. Because the disclosed invention is considered to be broad in its scope and its significance to the semiconductor industry, it should be understood that the description and the drawings are for illustrative purposes and should not be used to limit the scope of the invention, since variations and modifications will occur to those skilled in the art.

What is claimed is:

1. In the fabrication of an electronic structure including a layer of semiconductor material and at least one electronic device formed thereon, wherein a patterned layer of resist material is disposed on a surface of different material than the resist material, a method of removing the patterned layer of resist material from the surface of different material, said method comprising:

decomposing resist material via chemical reaction from said layer of resist material by exposing said layer of resist material to the flame of a combustible gas, wherein the flame contains resist-attacking reactive products;

retaining the structure including the surface of different material in a condition, which is essentially unaltered physically and chemically with respect to its condition prior to the exposure of the layer of resist material to the flame of the combustible gas, during the decomposition of resist material; and discontinuing the exposure of the structure to the flame of the combustible gas when only said layer of resist material has been removed by decomposition of the resist material thereof while the structure including the surface of different material remains in its unaltered condition.

2. A method as set forth in claim 1, wherein said layer of resist material is exposed to said flame such that the flame directly contacts the layer of resist material.

3. A method as set forth in claim 2, wherein said combustible gas comprises a hydrogen-oxygen mixture.

4. A method as set forth in claim 3, wherein hydrogen is present in said combustible gas mixture in a range of 5-95% by volume.

5. A method as set forth in claim 4, wherein hydrogen is present in said combustible gas mixture in a range of 40-67% by volume.

6. A method as set forth in claim 2, wherein said layer of resist material is subjected to a plurality of exposures to said flame, each exposure being for a relatively short period of time.

7. A method as set forth in claim 2, further including placing the structure on which the resist layer is disposed on conveyor means, and passing the conveyor means under said flame so that the resist layer is exposed to said flame as a result of the motion of said conveyor means operating to move said structure with said resist layer disposed thereon under said flame.

8. A method as set forth in claim 7, further including regulating the stopping and starting of said conveyor means so as to momentarily position said structure with said resist layer disposed thereon under said flame for a predetermined period of time.

9. A method as set forth in claim 2, further including monitoring the temperature of the structure during the exposure of said layer of resist material to the flame of the combustible gas to avoid overheating in retaining the structure including the surface of different material in its unaltered condition.

10. A method as set forth in claim 9, wherein the structure is heated to a temperature on the order of 60°–360° C. while the layer of resist material is exposed to the flame of the combustible gas.

11. A method as set forth in claim 10, wherein the layer of resist material is exposed to the flame of the combustible gas over a time period of the order of 2–15 seconds.

12. In the fabrication of an electronic structure including a layer of semiconductor material and at least one electronic device formed thereon, wherein a patterned layer of resist material is disposed on a surface of different material than the resist material, a method of removing the patterned layer of resist material from the surface of different material, said method comprising:

positioning the structure with the resist layer thereon on a support member;

rotating the support member;

decomposing resist material via chemical reaction from said layer of resist material by exposing said layer of resist material to the flame of a combustible gas impinging on the resist layer, wherein the flame contains resist-attacking reactive products and emanates from a flame outlet of an arm suspended over the support member, in response to the rotation of the support member passing the structure with the resist layer thereon beneath the flame outlet;

retaining the structure including the surface of different material in a condition, which is essentially unaltered physically and chemically with respect to its condition prior to the exposure of the resist layer to the flame of the combustible gas, during the decomposition of resist material; and repeating the exposure of the resist layer to the flame by continuing the rotation of the support member to pass the structure with the resist layer thereon beneath the flame outlet for each revolution of the support member until all of the resist layer has been removed by decomposition of the resist material thereof in response to the flame exposure while the structure including the surface of different material remains in its unaltered condition.

13. A method as set forth in claim 3, wherein the resist-attacking reactive products contained in the flame of the combustible gas include monatomic oxygen.

14. A method as set forth in claim 3, wherein the resist-attacking products contained in the flame of the combustible gas include ionic particles and monatomic oxygen.

15. A method as set forth in claim 12, wherein the resist-attacking reactive products contained in the flame of the combustible gas include monatomic oxygen.

16. A method as set forth in claim 12, wherein the resist-attacking reactive products contained in the flame of the combustible gas include ionic particles and monatomic oxygen.

* * * * *